United States Patent
Cho et al.

(10) Patent No.: US 7,457,226 B2
(45) Date of Patent: Nov. 25, 2008

(54) HEAT SOURCE HAVING THERMOELECTRIC ELEMENT, OPTICAL PICKUP ASSEMBLY EMPLOYING THE SAME, AND METHOD OF REDUCING TEMPERATURE THEREIN

(75) Inventors: Won-Ik Cho, Seoul (KR); Pyong-yong Seong, Seoul (KR); Dong-ryeol Lee, Seoul (KR); Ki-bok Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 511 days.

(21) Appl. No.: 10/937,255

(22) Filed: Sep. 10, 2004

(65) Prior Publication Data

US 2005/0099920 A1    May 12, 2005

(30) Foreign Application Priority Data

Nov. 10, 2003 (KR) .................... 10-2003-0079170

(51) Int. Cl.
    *G11B 7/00* (2006.01)
(52) U.S. Cl. ............... 369/121; 369/122; 720/648; 720/649
(58) Field of Classification Search ............ None
    See application file for complete search history.

(56) References Cited

U.S. PATENT DOCUMENTS

| 4,279,292 | A | * | 7/1981 | Swiatosz ................. 165/61 |
| 5,051,975 | A | * | 9/1991 | Tadokoro et al. .......... 369/44.39 |
| 5,581,523 | A | * | 12/1996 | Seki et al. .............. 369/44.11 |
| 6,043,911 | A | * | 3/2000 | Yang ................... 359/15 |
| 6,181,720 | B1 | * | 1/2001 | Kanemoto et al. ......... 372/43.01 |

FOREIGN PATENT DOCUMENTS

| JP | 7-98881 | 4/1995 |
| JP | 11-054848 | 2/1999 |
| JP | 2001-76388 | 3/2001 |
| JP | 2002-184166 | 6/2002 |
| JP | 2002-298414 | 10/2002 |
| KR | 1998-39164 | 8/1998 |
| KR | 1998-039164 | 8/1998 |

OTHER PUBLICATIONS

Korean Office Action, ApplicationNo. 10-2003-0079170, mailed Sep. 28, 2005.
Chinese Office Action for Application No. 2004100959876; mailed Apr. 7, 2006.

* cited by examiner

*Primary Examiner*—Joseph Feild
*Assistant Examiner*—Parul Gupta
(74) *Attorney, Agent, or Firm*—Staas & Halsey LLP

(57) ABSTRACT

A heat source having a device emitting heat, a case protecting and supporting the device, and a thermoelectric element absorbing the heat emitted from the device and dissipating the heat to an outside.

16 Claims, 5 Drawing Sheets

HEAT SOURCE HAVING THERMOELECTRIC ELEMENT, OPTICAL PICKUP ASSEMBLY EMPLOYING THE SAME, AND METHOD OF REDUCING TEMPERATURE THEREIN

CROSS-REFERENCE TO RELATED APPLICATIONS

This application claims the priority of Korean Patent Application No. 2003-79170, filed on Nov. 10, 2003, in the Korean Intellectual Property Office, the disclosure of which is incorporated herein by reference.

BACKGROUND OF THE INVENTION

1. Field of the Invention

The present invention relates to an optical pickup, and more particularly, to a method of dissipating heat from an optical pickup, to efficiently reduce heat from a heat source, and an apparatus for the same.

2. Description of the Related Art

In general, an optical pickup of an optical disk driver is a driving element to record and reproduce peaks or marks on and from a disk. An increase in a temperature of an optical pickup, a laser diode, or other heat sources deteriorates a reproducing quality when reproducing, increases a wavelength of a laser and thereby reduces an ability to perform a high speed recording, and generates a large jitter when recording. Since the optical pickup of the optical disk driver includes a laser diode, a hologram optical device, and a photodiode, it is required to maintain an internal temperature of the optical pickup lower than a predetermined level, to perform stable recording and reproducing.

But as the size and the weight of the optical disk driver are decreased, a conventional passive method of reducing an internal temperature of an optical pickup, such as natural thermal conduction and convection, cannot reduce the internal temperature sufficiently. In particular, heat from a laser diode and a photodiode, which are necessary elements for recording and reproducing, largely affects the performance of an optical pickup. The most general method of reducing the internal temperature of an optical pickup is by dissipating the heat from the laser diode and the photodiode through thermal conduction and convection using a cooling fin or a cooling plate connected directly to the laser diode and the photodiode.

But such a conventional method of dissipating heat through thermal conduction and convention using the cooling fin or the cooling plate is insufficient to effectively reduce the internal temperature of an optical pickup. In other words, as the size and the weight of a driver decrease, the conventional passive method of natural thermal conduction and convection using the cooling fin or the cooling plate cannot properly reduce the internal temperature of an optical pickup. Accordingly, the increase in the temperature still occurs, resulting in the increase in jitter and deterioration of reproducing quality due to misalignment of detection portions of a main beam and a side beam of a photodiode.

In addition, due to the increase in temperature, a laser wavelength is changed as well as lowering a laser power when recording, thus a stable recording cannot be performed.

SUMMARY OF THE INVENTION

The present invention provides a heat source having a thermoelectric element, such as a Peltier element, to actively reduce a temperature by absorbing and dissipating heat from the heat source.

The present invention also provides an optical pickup assembly to record and/or reproduce data, the optical pickup assembly having a heat source with a temperature reduced through actively absorbing and dissipating heat from the heat source using a thermoelectric element, such as a Peltier element.

The present invention also provides a method of reducing an internal temperature of an optical pickup by actively absorbing and dissipating heat from a heat source using a thermoelectric element, such as a Peltier element.

According to an aspect of the present invention, there is provided a heat source, comprising a device emitting heat, a case protecting and supporting the device, and a thermoelectric element absorbing the heat emitted from the device and dissipating the heat to an outside.

According to another aspect of the present invention, there is provided an optical pickup assembly having a heat source, the optical pickup recording and/or reproducing data on and/or from an optical disk by radiating a beam, the optical pickup assembly comprising a light source generating the beam, a case protecting and supporting the light source, and a thermoelectric element absorbing heat generated from the light source and dissipating the heat to an outside.

According to still another aspect of the present invention, there is provided a method of reducing an internal temperature of an optical pickup recording and/or reproducing data on and/or from an optical disk, comprising determining whether the optical pickup is in a recording mode, measuring the internal temperature of the optical pickup when the optical pickup is in the recording mode, comparing the measured internal temperature to a predetermined critical temperature, and applying currents to a thermoelectric element when the measured internal temperature is higher than the predetermined critical temperature.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings, of which.

DETAILED DESCRIPTION OF THE PREFERRED EMBODIMENTS

Figure 1:
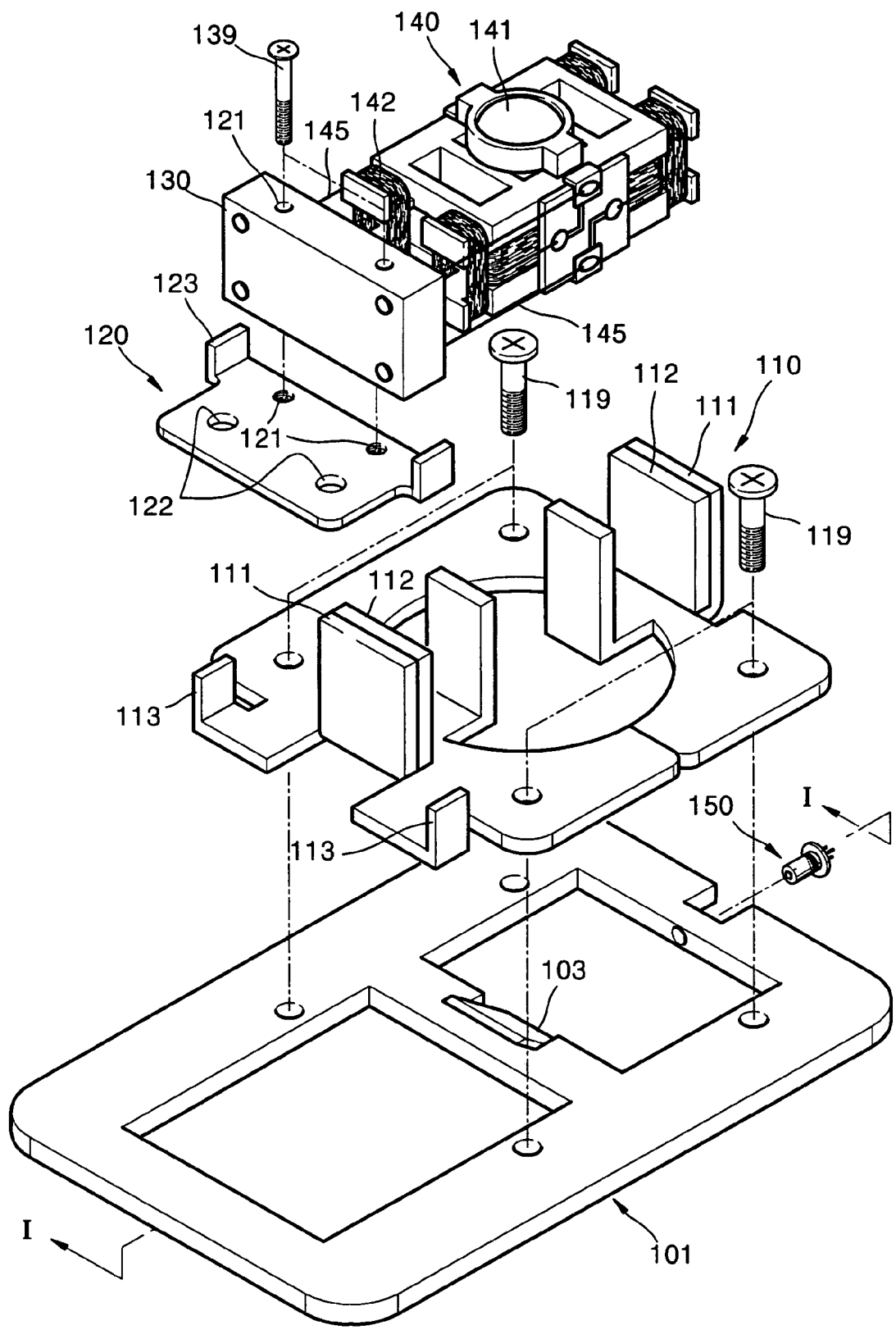
FIG. 1 is a perspective view illustrating an optical pickup assembly having a heat source with a thermoelectric element according to a first embodiment of the present invention.

Reference will now be made in detail to the embodiments of the present invention, examples of which are illustrated in the accompanying drawings, wherein like reference numerals refer to the like elements throughout. The embodiments are described to explain the present invention by referring to the figures.

Figure 2:
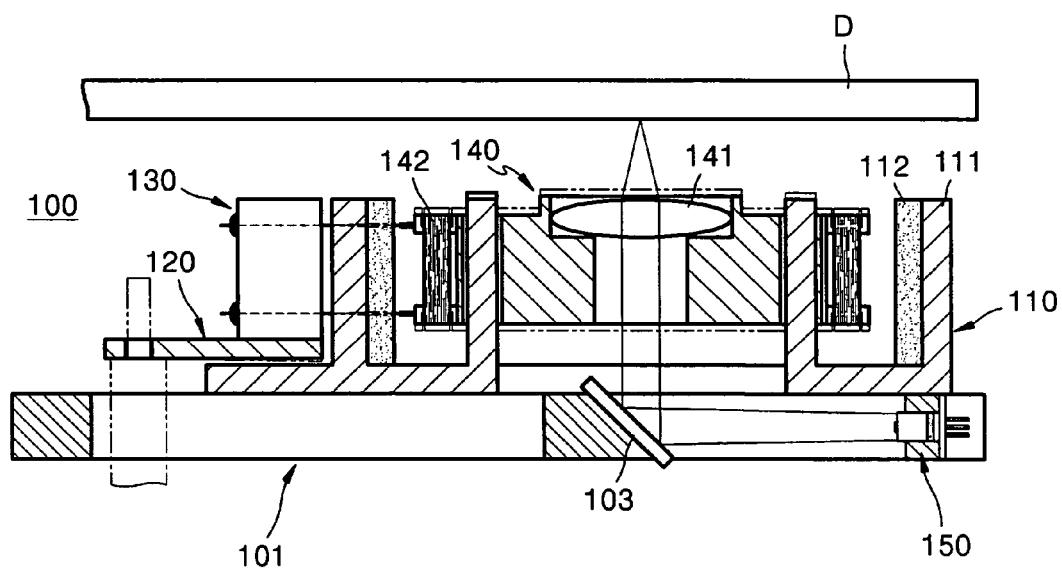
FIG. 2 is a sectional view illustrating the optical pickup assembly of FIG. 1 along the line I-I of FIG. 1.

FIG. 1 is a perspective view illustrating an optical pickup assembly having a heat source with a thermoelectric element according to a first embodiment of the present invention, and FIG. 2 is a sectional view illustrating the optical pickup assembly of of FIG. 1 along the line I-I of FIG. 1.

Referring to FIGS. 1 and 2, an optical pickup assembly 100 includes a base 101, a yoke unit 110, a holder plate 120, a holder 130, a bobbin 140, and a light source 150.

The base 101 includes the light source 150, which generates a laser beam, and a reflection mirror 103, which changes the optical path of the laser beam emitted from the light source 150.

The yoke unit 110 is fixed on the base 101 using screws 119, while having a plurality of yoke plates 111 and bonding pieces 113 formed by a press process. Magnets 112 are fixed on the yoke plates 111, respectively.

The holder plate 120 is located above the yoke unit 110 while having screw holes 121 to fix the holder 130, and adjustment holes 122 to determine a location of the bobbin 140. In addition, the holder plate 120 includes protrusion pieces 123 welded to the bonding pieces 113 of the yoke unit 110. The holder 130 is fixed on the holder plate 120 using screws 139, inserted through screw holes 121 of the holder 130, and combined to the screw holes 121 of the holder plate 120.

The bobbin 140 is supported at respective first ends of suspension wires 145, and respective second ends of the suspension wires 145 are fixed to the holder 130. An objective lens 141 for focuses the laser beam emitted from the light source 150, which is installed on the base 101, on a disk D. The objective lens 141 is installed at the upper portion of the bobbin 140, and coil members 142 are installed at sides of the bobbin 140. The suspension wires 145 are electrically connected to the coil members 142 to supply currents to the coil members 142, while supporting the bobbin 140 to maintain a raised state from the yoke plate 111.

Operation of the optical pickup assembly 100 according to an embodiment of the present invention will now be described.

To record data on the optical disk D, the light source 150, including a laser diode or a semiconductor diode, is turned on to emit an optical beam to the reflection mirror 103. Then, the reflected optical beam is focused on the optical disk D through an objective lens 141. When electric signals are applied to coil members 142 based on data to be recorded, the objective lens 141 is operated according to the applied electric signals, thus recording desired data on the optical disk D.

The present invention provides the optical pickup assembly 100 using an active thermoelectric element, such as a Peltier element, as well as using the passive method of natural thermal conduction and convection by attaching a cooling plate on the bottom of the light source 150.

Figure 3:
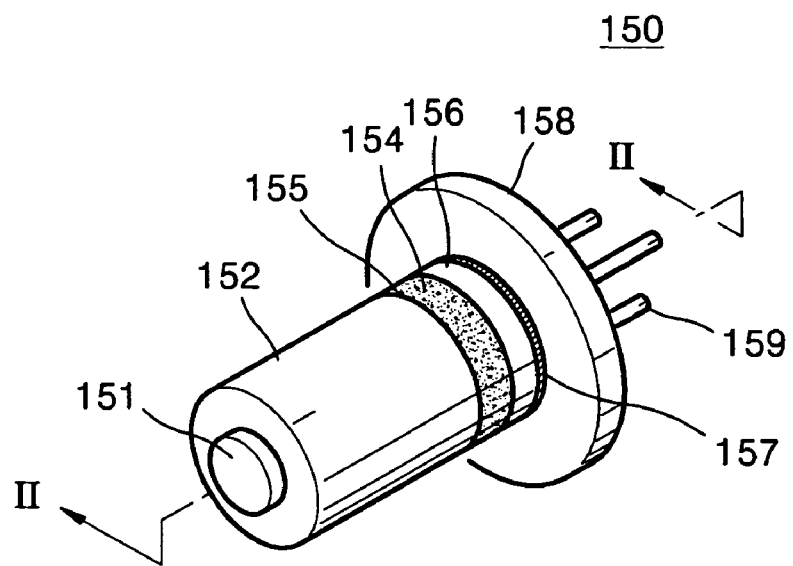
FIG. 3 is a perspective view illustrating the heat source of FIG. 1.
Figure 4:
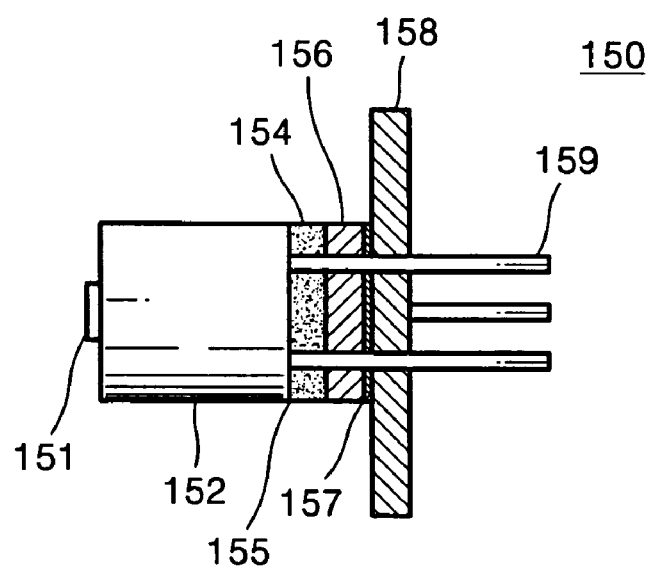
FIG. 4 is a sectional view illustrating the heat source of FIG. 3 along the line II-II of FIG. 3.

FIG. 3 is a perspective view illustrating a light source 150 of the optical pickup assembly 100 according to the first embodiment of the present invention, and FIG. 4 is a sectional view illustrating the light source 150 of FIG. 3 along the line II-II.

Referring to FIGS. 3 and 4, the light source 150 includes a main body having an upper surface with a hole 151, a cylinder shaped cap 152, a stem 155 with a plurality of leads 159, a thermoelectric element 156 bonded to the stem 155 using a conductive adhesive 154 like a gap filler, and a cooling plate 158 bonded to the thermoelectric element 156 by using a conductive adhesive 157 like a gap filler.

According to one embodiment, the thermoelectric element 156 is a Peltier element, which uses a Peltier effect. The principle of the Peltier element is that a loop is formed of different metals, and when current flows to the loop, one bonding unit generates heat and an other bonding unit absorbs the heat.

More specifically, a heat absorbing surface of the Peltier element is adhered to the stem 155 of a laser diode using the conductive adhesive 154, and a heat dissipating surface of the Peltier element is adhered to the cooling plate 158 using the conductive adhesive 157. Here, the conductive adhesives 154 and 157 are made of a conductive material and adhered closely to the Peltier element, to transmit heat from the stem 155 to the outside.

In the first embodiment, current is introduced to the stem 155 to drive the laser diode, and the initial laser oscillation occurs at a portion adjacent to the stem 155, resulting in the generation of heat from the stem 155. Thus, a heat source can be efficiently cooled by attaching the thermoelectric element 156 to the stem 155.

According to one embodiment, a portion of the base 101 corresponding to the rear surface of the stem 155 is opened to the outside, as is shown in FIGS. 1 and 2. Thus, the internal temperature of the optical pickup can be efficiently reduced by attaching the thermoelectric element on a rear surface of the stem.

Figure 5:
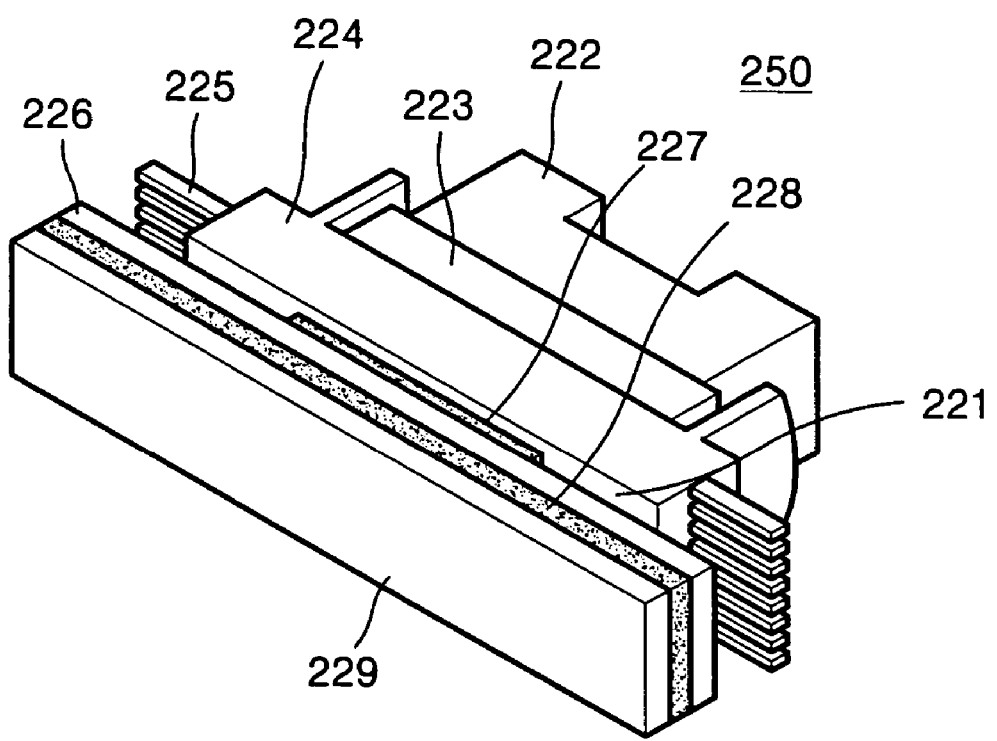
FIG. 5 is a perspective view illustrating an optical element having a heat source according to a second embodiment of the present invention.

FIG. 5 is a perspective view illustrating a light source having a hologram optical element (HOE), a laser diode, and a photodiode according to a second embodiment of the present invention.

According to one embodiment, when a small driver is required, such as for a laptop computer, an optical element 250 including a laser diode, an HOE, and a photodiode is provided.

Referring to FIG. 5, the optical element 250 includes: an optical member 222 having an HOE and a laser diode; a cap 223, which protects the optical element 250; a lead frame 224 having a plurality of leads 225 receiving electric signals from the outside; a thermoelectric element 226, which is bonded to a stem 221 as a bottom of the optical member 222 using a conductive adhesive 227; and a cooling plate 229, which is bonded to the thermoelectric element 226 using a conductive adhesive 228.

According to one embodiment, the thermoelectric element 226 is a Peltier element. A heat absorbing surface of the Peltier element is bonded to a laser diode, or the stem 221 of the optical member 222 including the laser diode and the photodiode, and a heat dissipating surface of the Peltier element is bonded to the cooling plate 229 using the conductive adhesive 228.

Respective shapes of the cooling plate 158 and 229 and the thermoelectric element 156 and 226 may vary depending on the structure of the stem 155 and 221 of a heat source. According to one embodiment, the cooling plate is bonded to the stem of a heat source and the thermoelectric element is bonded thereon, and another cooling plate is bonded to the thermoelectric element, to improve the dissipation of heat.

Cooling plates are used in the first and second embodiments of the present invention, but a cooling fin, used instead of the cooling plate, can generate the same effect.

A light source is used as a heat source in the first and second embodiments of the present invention, but a photodiode, as a light receiving element, may be used as a heat source.

Figure 6:
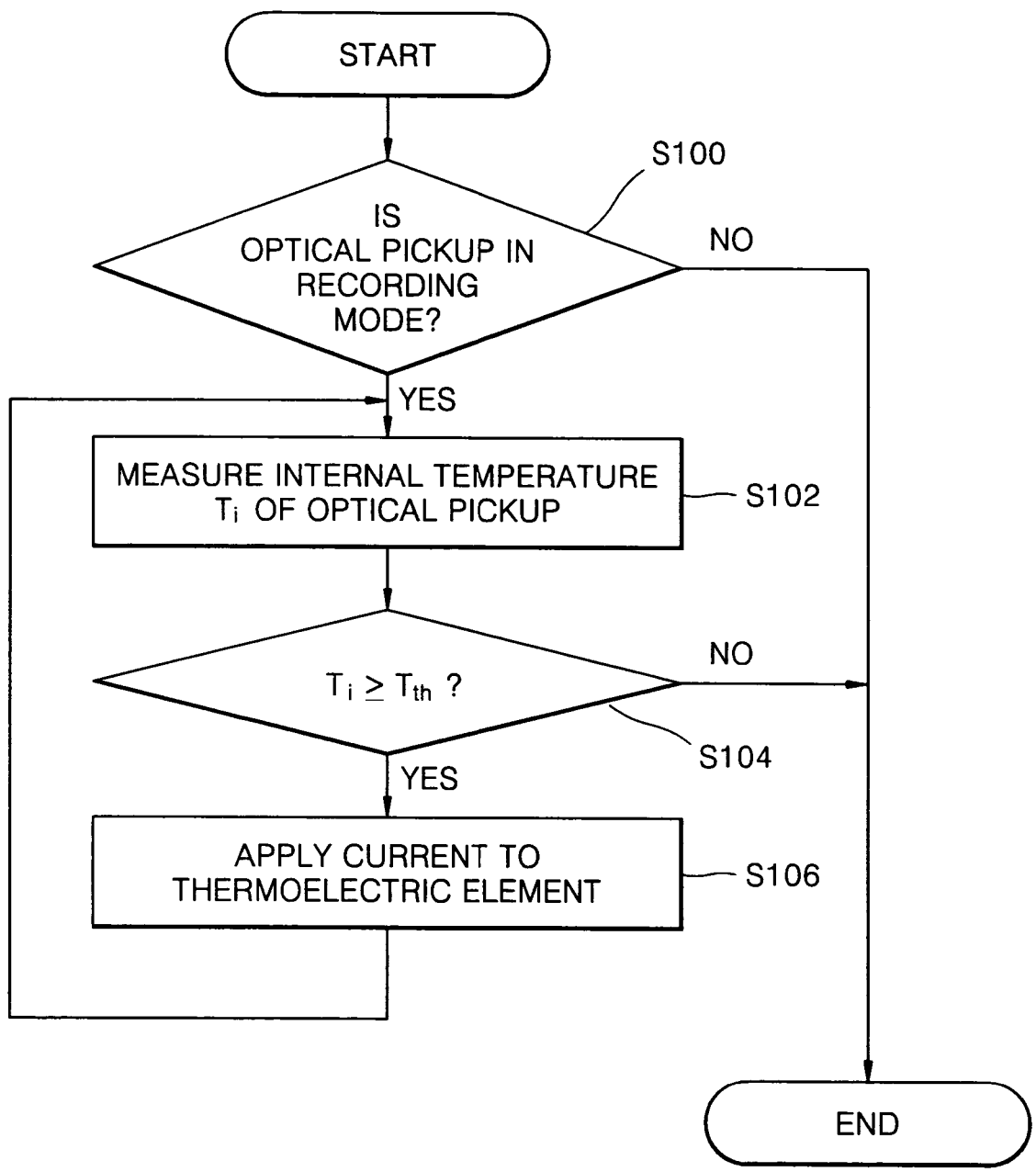
FIG. 6 is a flowchart depicting a method of reducing an internal temperature of an optical pickup assembly having a heat source according to the second embodiment of the present invention.

FIG. 6 is a flowchart depicting a method of reducing the internal temperature of an optical pickup assembly having a heat source according to the second embodiment of the present invention.

First, it is determined whether an optical pickup is in a recording mode, in operation S100. In the case where the optical pickup is in a mode other than the recording mode, the method ends.

When the optical pickup is in the recording mode, the internal temperature Ti of the optical pickup is measured using a temperature sensor, in operation S102.

Thereafter, the measured internal temperature Ti is compared to a predetermined critical temperature Tth, in operation S104. When the measured internal temperature Ti is lower than the predetermined critical temperature Tth, the method ends. Otherwise, operation S106 is performed.

In operation S106, currents are applied to the thermoelectric element 226, which is bonded to a heat source, like a laser diode or a photodiode, using a predetermined power supply. The thermoelectric element 226 absorbs heat from the heat source and emits the heat to the outside to reduce the internal temperature of the optical pickup.

Thereafter, the operations S102 through S106 are repeated to reduce the internal temperature of the optical pickup to a desired temperature.

According to one embodiment, the power applied to the Peltier element is on-off controlled using a DC power to reduce the temperature of the laser diode, and the power applied to the Peltier element is open-loop controlled through a driver IC performing a PWM (pulse width modification) or bridge-tied load (BTL) driving.

According to one embodiment, temperature of the laser diode or the optical pickup is measured using a temperature sensor, such as a thermistor, that is arranged adjacent to the laser diode or in the optical pickup, and the temperature sensor is closed-loop controlled through a driver IC of performing a PWM or BTL driving. The power is applied from a device through a connector of the optical pickup. According to one embodiment, the thermoelectric element 226 does not include a driver or a coolant, thus preventing generation of oscillation noises and contamination.

According to embodiments of the present invention, a thermoelectric element is bonded to a heat source of a device, such as a laser diode, to efficiently reduce the internal temperature of an optical pickup.

In addition, the thermoelectric element is driven while recording data on an optical disk using the optical pickup, thus efficiently controlling the internal temperature of the optical pickup compared to a method of using a conventional thermoelectric element, which receives electric power while reproducing data from an optical disk.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A heat source comprising:
a device emitting heat;
a case protecting and supporting the device, the case including a cap and a stem;
a thermoelectric element absorbing the heat emitted from the device and dissipating the heat to an outside; and
a natural cooling unit cooling by thermal conduction and convection,
wherein the thermoelectric element is between the stem and the natural cooling unit,
the device is a laser diode including a plurality of leads to apply external electric signals, and
the thermoelectric element has a number of through holes corresponding to a number of leads, to connect the leads to the external electric signals.

2. The heat source of claim 1, wherein the thermoelectric element is bonded to the case using a conductive adhesive.

3. The heat source of claim 1, wherein the natural cooling unit is bonded to the thermoelectric element using a conductive adhesive.

4. The heat source of claim 1, wherein the thermoelectric element is a Peltier element.

5. An optical pickup assembly recording and/or reproducing data on and/or from an optical disk by radiating a beam, wherein the optical pickup assembly includes the heat source of claim 1.

6. A heat source for an optical pickup assembly, comprising:
a cap;
a stem connected with a plurality of leads to receive an electrical signal;
a thermoelectric element bonded with the stem using a first conductive adhesive; and
a cooling plate bonded with the thermoelectric element using a second conductive adhesive,
wherein the thermoelectric element is between the stem and the natural cooling unit, and
a temperature of the heat source is measured using a temperature sensor that is closed-loop controlled through a driver integrated circuit performing one of a pulse width modification driving and bridge-tied load driving.

7. The heat source according to claim 6, wherein the first and second conductive adhesives are used as a gap filler.

8. The heat source according to claim 6, wherein the cap is cylindrical.

9. The heat source according to claim 6, wherein the thermoelectric element comprises:
a loop made of a plurality of metals, such that when a current is applied to the loop, the thermoelectric element conducts heat from the stem via the first conductive adhesive, and dissipates the heat to the cooling plate via the second conductive adhesive.

10. The heat source according to claim 6, wherein the thermoelectric element is a Peltier element having a heat absorbing surface, and a heat dissipating surface.

11. The heat source according to claim 6, wherein:
the heat source further comprises
an optical member having a hologram optical element and a laser diode, and
a lead frame connected with the stem and housing the plurality of leads; and the cap protects the optical element.

12. The heat source according to claim 11, wherein the thermoelectric element is a Peltier element having a heat absorbing surface, and a heat dissipating surface.

13. The heat source according to claim 6, wherein:
the cooling plate is a first cooling plate; and
the heat source further comprises a second cooling plate bonded between the stem and the thermoelectric element, to improve heat dissipation.

14. The heat source according to claim 6, wherein the heat source is a light receiving element.

15. The heat source according to claim 14, wherein the light receiving element is a photodiode.

16. A heat source for an optical pickup assembly, comprising:
- a cap;
- a stem connected with a plurality of leads to receive an electrical signal;
- a thermoelectric element bonded with the stem using a first conductive adhesive; and
- a cooling plate bonded with the thermoelectric element using a second conductive adhesive, wherein power applied to the thermoelectric element is on-off controlled using a DC power to reduce the temperature of the heat source, and the power applied to the thermoelectric element is open-loop controlled through a driver integrated circuit performing one of a pulse width modification driving and bridge-tied load driving.

* * * * *